United States Patent
Yu

(10) Patent No.: US 10,020,548 B2
(45) Date of Patent: Jul. 10, 2018

(54) GAUGING METHOD FOR BATTERY DISCHARGE-CAPACITY CORRESPONDING TO TEMPERATURE AND ELECTRONIC DEVICE USING THE SAME

(71) Applicant: GETAC TECHNOLOGY CORPORATION, Hsinchu County (TW)

(72) Inventor: Wen-Huan Yu, Taipei (TW)

(73) Assignee: GETAC TECHNOLOGY CORPORATION, Hsinchu County (TW)

( * ) Notice: Subject to any disclaimer, the term of this patent is extended or adjusted under 35 U.S.C. 154(b) by 61 days.

(21) Appl. No.: 15/231,721

(22) Filed: Aug. 8, 2016

(65) Prior Publication Data

US 2018/0040928 A1    Feb. 8, 2018

(51) Int. Cl.
| H01M 10/48 | (2006.01) |
| G01R 31/36 | (2006.01) |
| H01M 10/42 | (2006.01) |

(52) U.S. Cl.
CPC ...... *H01M 10/486* (2013.01); *G01R 31/3624* (2013.01); *G01R 31/3662* (2013.01); *H01M 10/425* (2013.01); *H01M 2010/4271* (2013.01); *H01M 2220/30* (2013.01)

(58) Field of Classification Search
USPC .................. 324/430–434; 320/134, 136, 162
See application file for complete search history.

(56) References Cited

U.S. PATENT DOCUMENTS

| 5,325,041 | A  | * | 6/1994  | Briggs     | G01R 31/361  |
|           |    |   |         |            | 320/149      |
| 6,832,171 | B2 | * | 12/2004 | Barsoukov  | G01R 31/3662 |
|           |    |   |         |            | 320/132      |
| 2005/0035743 | A1 | * | 2/2005 | Kawakami   | G01R 31/3662 |
|           |    |   |         |            | 320/162      |
| 2009/0254290 | A1 |   | 10/2009 | Kim et al. |              |
| 2012/0217934 | A1 | * | 8/2012 | Zhou       | H01M 10/44   |
|           |    |   |         |            | 320/136      |

FOREIGN PATENT DOCUMENTS

| CN | 103135058 A | 6/2013 |
| CN | 104714185 A | 6/2015 |
| CN | 105576304 A | 5/2016 |
| JP | 2006038747  | 2/2006 |

* cited by examiner

*Primary Examiner* — Vincent Q Nguyen

(57) ABSTRACT

A gauging method for a battery discharge-capacity corresponding to a temperature includes steps of detecting a temperature of a battery module of an electronic device according to a predetermined condition; detecting an internal impedance of the battery module and estimating the battery discharge-capacity of the battery module according to the internal impedance if the temperature meets the predetermined condition; and detecting an output current and a voltage of the battery module according to the temperature and calculating the battery discharge-capacity of the battery module according to the temperature, the voltage and the output current if the temperature does not meet the predetermined condition.

15 Claims, 3 Drawing Sheets

GAUGING METHOD FOR BATTERY DISCHARGE-CAPACITY CORRESPONDING TO TEMPERATURE AND ELECTRONIC DEVICE USING THE SAME

BACKGROUND OF THE INVENTION

Field of the Invention

The present invention relates to battery discharge-capacity management technology and, more particularly, to a gauging method for a battery discharge-capacity corresponding to a temperature and an electronic device using the same.

Description of the Prior Art

Portable electronic devices, such as mobile phones, notebooks (NB), and personal digital assistants (PDA), come into wide use rapidly, because they are powered by battery modules and thus portable.

In practice, to meet voltage requirements, plenty application scenarios necessitate multiple series-connected unit batteries so as to effectuate a battery module operating at a required voltage. To enable the optimal performance of a battery module and extend the service life of the battery module, an electronic device is usually equipped with a battery management system for monitoring the battery module. The battery management system is useful in accessing state information pertaining to the battery module, providing overcharging/overdischarging protection, as well as equalizing battery voltage and/or estimating battery residual discharge-capacity. However, an unexpected insufficient power supply may cause the electronic device to shut down instantly and thus suffer a loss of data or get damaged. For the aforesaid reasons, recent years see the emergence of an important function of a battery module power supply system, that is, monitoring battery states in terms of temperature, voltage, current, residual capacitance state, and the like, to enable the optimal performance of battery modules.

According to prior art, a battery management system of an electronic device estimates a battery residual discharge-capacity with a gauging technique developed by Texas Instruments (TI). However, at a low temperature, the TI gauging technique is obviously inaccurate and susceptible to erroneous judgements; as a result, the electronic device is likely to malfunction because of erroneous battery-related information.

SUMMARY OF THE INVENTION

In an embodiment, a gauging method for a battery discharge-capacity corresponding to a temperature, comprising the steps of: detecting a temperature of a battery module of the electronic device according to a predetermined condition; detecting the internal impedance of the battery module and estimating the battery discharge-capacity of the battery module according to the internal impedance if the temperature meets the predetermined condition; and detecting a voltage and an output current of the battery module and calculating the battery discharge-capacity of the battery module according to the temperature, the voltage and the output current if the temperature does not meet the predetermined condition.

In an embodiment, an electronic device for gauging a battery discharge-capacity corresponding to a temperature, comprising a battery module, a temperature sensing unit, a storing unit, and a processing unit. The processing unit is coupled to the battery module, the temperature sensing unit, and the storing unit. The battery module supplies power to the electronic device. The temperature sensing unit measures a temperature of the battery module. The storing unit stores a predetermined condition. The processing unit receives the temperature and confirms the received temperature according to the predetermined condition. If the temperature meets the predetermined condition, the processing unit will detect the internal impedance of the battery module and estimate the battery discharge-capacity of the battery module according to the internal impedance. If temperature does not meet the predetermined condition, the processing unit will detect a voltage and an output current of the battery module and calculate the battery discharge-capacity of the battery module according to the temperature, the voltage and the output current.

In conclusion, according to embodiments of the present invention, a gauging method for a battery discharge-capacity corresponding to a temperature and an electronic device using the same are characterized in that: the electronic device estimates a residual discharge-capacity of a battery module by a hybrid battery algorithm so that, at a low temperature, the residual discharge-capacity of the battery module is precisely estimated, so as to prevent the electronic device from malfunctioning because of erroneous battery-related information and/or prevent the electronic device from shutting down unexpectedly because of power supply interruptions.

DETAILED DESCRIPTION OF THE EMBODIMENTS

Figure 1:
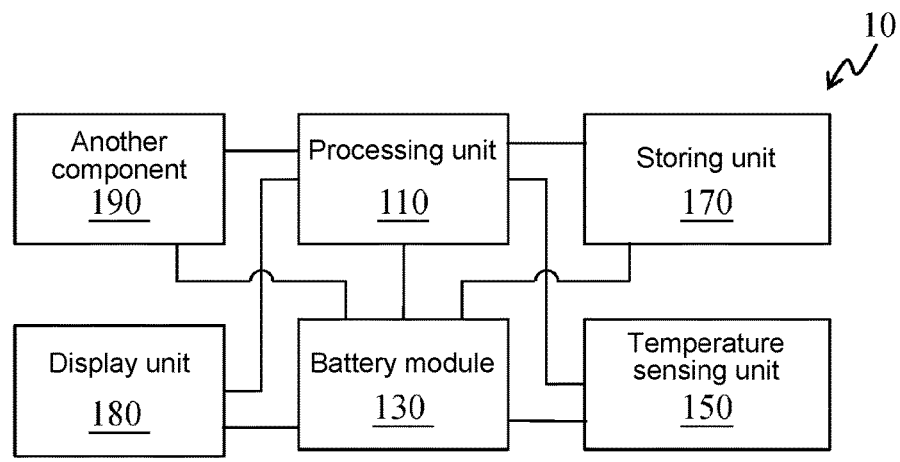
FIG. 1 is a function block diagram of an electronic device for gauging a battery discharge-capacity corresponding to a temperature according to an embodiment of the present invention.

Referring to FIG. 1, an electronic device for gauging a battery discharge-capacity corresponding to a temperature (hereinafter abbreviated as "electronic device 10") comprises a processing unit 110, a battery module 130, a temperature sensing unit 150, a storing unit 170, and another component 190. The processing unit 110 is coupled to the battery module 130, the temperature sensing unit 150, the storing unit 170 and another component 190. The temperature sensing unit 150 is coupled to (in contact with) or positioned proximate to the battery module 130.

Figure 2:
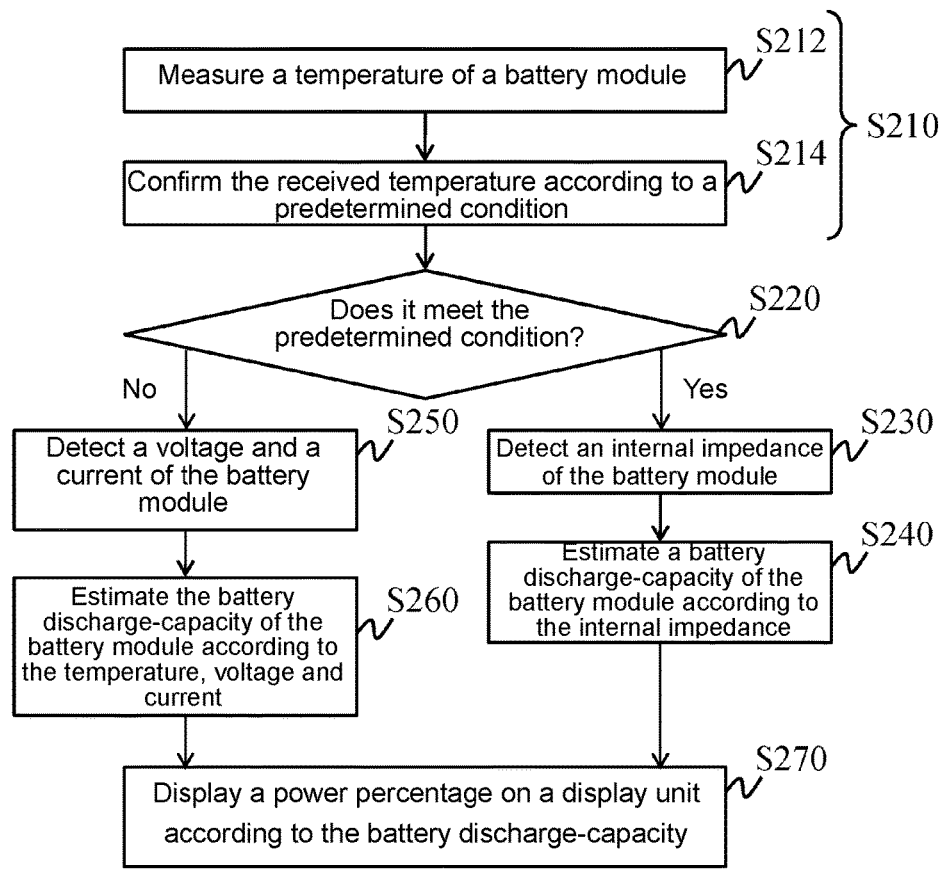
FIG. 2 is a flowchart of a gauging method for a battery discharge-capacity corresponding to a temperature according to an embodiment of the present invention.

Referring to FIG. 2, the temperature sensing unit 150 is for measuring the temperature of the battery module 130 (step S212). The temperature of the battery module 130 is the temperature of the battery module 130 itself or the ambient temperature of the battery module 130.

The processing unit 110 receives the temperature measured by the temperature sensing unit 150 and confirms the received temperature according to a predetermined condition (step S214), so as to confirm whether the temperature of the battery module 130 meets the predetermined condition (step S220).

If the received temperature meets the predetermined condition, the processing unit 110 will detect the internal impedance of the battery module 130 (step S230) and estimate the battery discharge-capacity of the battery module 130 according to the detected internal impedance of the battery module 130, that is, the residual discharge-capacity (step S240). Conversely, if the received temperature does not meet the predetermined condition, the processing unit 110 will detect the output current and the voltage of the battery module 130 (step S250) and calculate the battery discharge-capacity of the battery module 130, that is, the residual discharge-capacity (step S260) according to the output current, the voltage, and the temperature of the battery module 130.

In some embodiments, the predetermined condition is that the received temperature is higher than a temperature threshold. The processing unit 110 compares the received temperature with a temperature threshold. If the received temperature is higher than the temperature threshold, the processing unit 110 will determine that the received temperature meets the predetermined condition. Conversely, if the received temperature is lower than or equal to the temperature threshold, the processing unit 110 will determine that the received temperature does not meet the predetermined condition. In some embodiments, the temperature threshold is 0° C.

Figure 3:
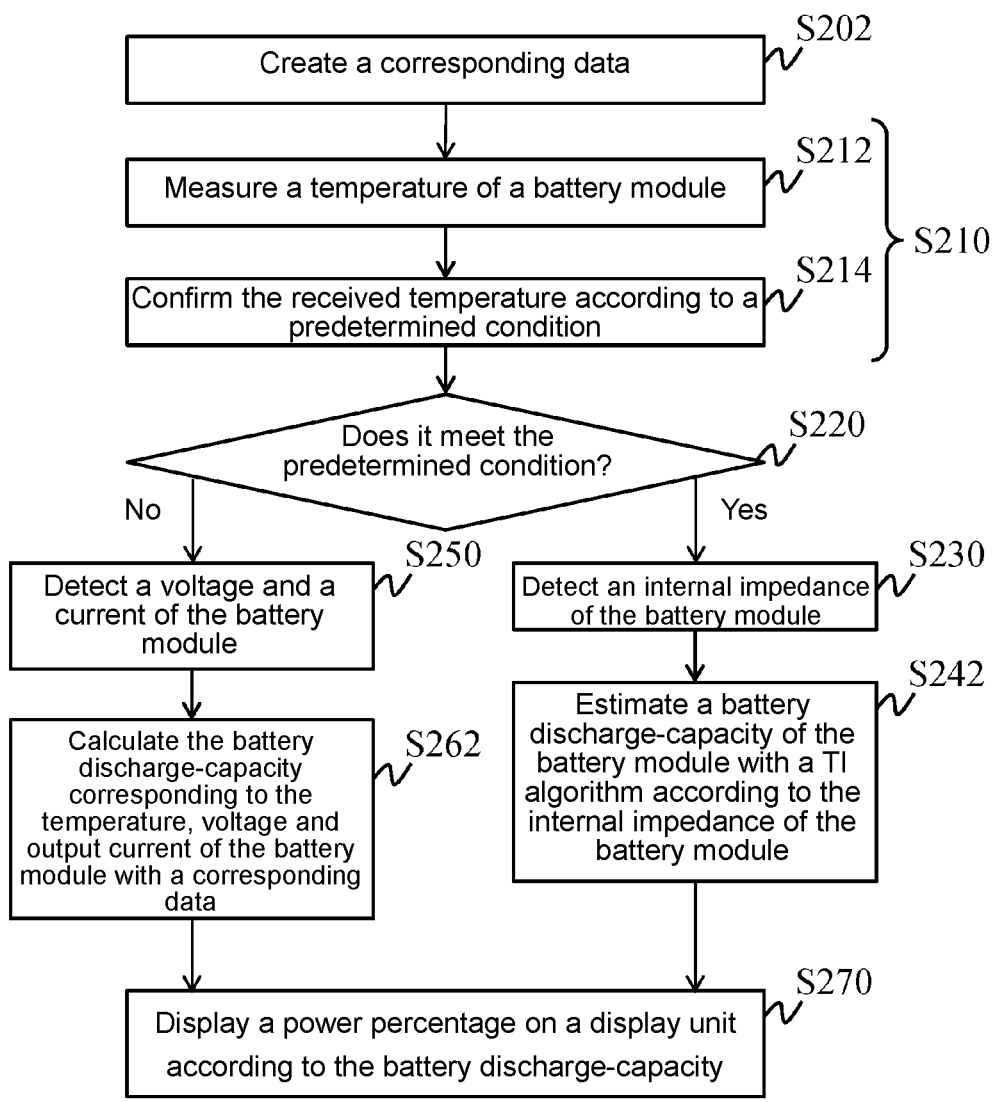
FIG. 3 is a flowchart of the gauging method for a battery discharge-capacity corresponding to a temperature according to another embodiment of the present invention.

In some embodiments of step S240, the processing unit 110 estimates the battery discharge-capacity of the battery module 130 according to the internal impedance detected with an algorithm developed by Texas Instruments (TI) (step S242), as shown in FIG. 3.

Figure 4:
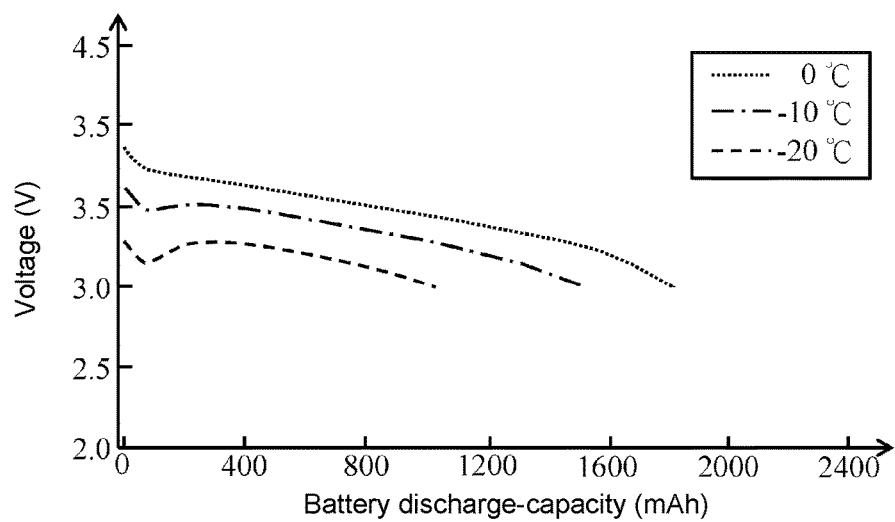
FIG. 4 is a schematic view of a corresponding data according to an embodiment of the present invention.
Figure 5:
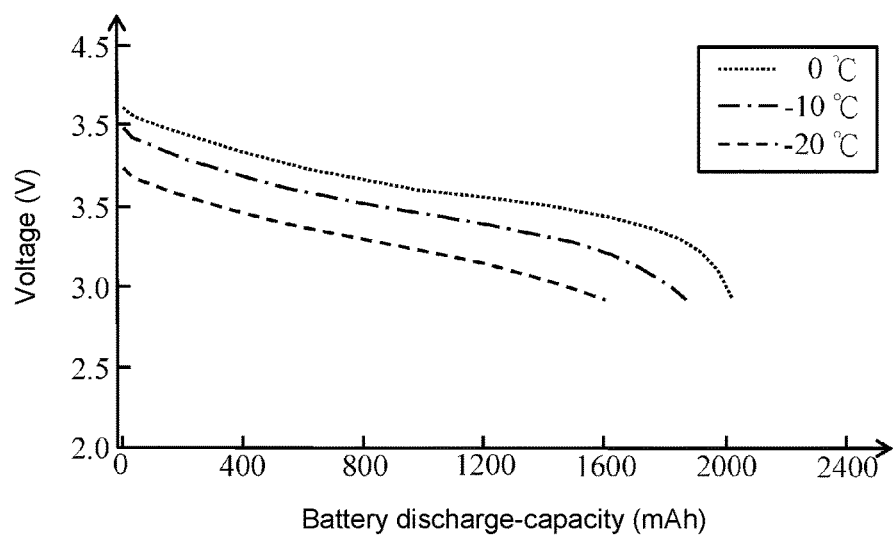
FIG. 5 is a schematic view of a corresponding data according to another embodiment of the present invention.

In some embodiments of step S260, the processing unit 110 calculates a battery discharge-capacity corresponding to the temperature, voltage and output current of the battery module 130 with a corresponding data (step S262), as shown in FIG. 3. In some embodiments, the corresponding data is provided in the form of curves of voltage against battery discharge-capacity at different temperatures and different output currents, as shown in FIG. 4 and FIG. 5. Referring to FIG. 4, there are shown curves of voltage against battery discharge-capacity at different temperatures of the battery module 130 of a UF515161SX lithium battery, with an output current of 2.100 A. Referring to FIG. 5, there are shown curves of voltage against battery discharge-capacity at different temperatures of the battery module 130 of a UF515161SX lithium battery, with an output current of 0.420 A.

In some embodiments of step S260, the processing unit 110 calculates a battery discharge-capacity with a corresponding data according to the temperature, voltage and output current of the battery module 130 by interpolation. For example, assuming that the corresponding data is provided in the form of curves of voltage against battery discharge-capacity at different temperatures and different output currents, the processing unit 110 selects a curve of voltage against battery discharge-capacity according to the temperature and output current of the battery module 130 and then use the voltage of the battery module 130 to obtain a preselected voltage and a preselected discharge-capacity which are correlated. Two preselected voltages approximate the voltage of the battery module 130. Afterward, the processing unit 110 performs interpolation on the preselected voltage and the preselected discharge-capacity, which are correlated, as well as the voltage of the battery module 130 to obtain the battery discharge-capacity which the voltage of the battery module 130 corresponds to.

Therefore, the processing unit 110 estimates the battery discharge-capacity of the battery module 130 with the TI gauging technique whenever the temperature meets the predetermined condition, and estimates the battery discharge-capacity of the battery module 130 with a corresponding low-temperature data whenever the temperature does not meet the predetermined condition.

In some embodiments, the corresponding data is created by conducting a plurality of discharging tests on the battery module 130 and prestored in the storing unit 170 (step 202), as shown in FIG. 3.

In some embodiments, the corresponding data is created by conducting a discharging test on a plurality of the battery modules with the same delivery condition as the battery module 130 and prestored in the storing unit 170 (step 202), as shown in FIG. 3.

In some embodiments, the electronic device 10 comprises a display unit 180. The display unit 180 is coupled to the processing unit 110. After calculating the battery discharge-capacity, the processing unit 110 displays a power percentage on the display unit 180 according to the calculated battery discharge-capacity (step S270) to inform the user of the residual discharge-capacity of the battery module 130. In some embodiments, the power percentage displayed on the display unit 180 comes in the form of a battery icon or digits. For instance, the processing unit 110 calculates the power percentage according to the calculated battery discharge-capacity and the full load of the battery module 130, and then the display unit 180 displays a corresponding battery icon or digits according to the calculated power percentage.

In some embodiments, after a temperature judgment (step S220), the processing unit 110 performs the detecting step, estimating step and displaying step (i.e., step S230, step S240 or S242 and step S270, or, alternatively, step S260, step S260 or S262 and step S270) repeatedly to discern and/or display the present residual discharge-capacity of the battery module 130.

In some embodiments, the processing unit 110 performs determining steps (i.e., step S210 and S220) anew at a predetermined time period to confirm the accepted way of estimating the battery discharge-capacity.

In some embodiments, the processing unit 110 is a microprocessor, a microcontroller, an embedded controller (EC) 30, a digital signal processor, a microcomputer, or a central processing unit (CPU).

In some embodiments, the battery module 130 stores power. The battery module 130 is coupled to power supply ends of components (for example, the processing unit 110, the temperature sensing unit 150, the storing unit 170 and another component 190) of the electronic device 10. The battery module 130 supplies stored power to components (for example, the processing unit 110, the temperature sensing unit 150, the storing unit 170 and another component 190) of the electronic device 10, while the electronic device 10 is operating. In some embodiments, the battery module 130 comprises one or more battery units.

In some embodiments, the storing unit 170 stores programs, parameters and data (for example, predetermined conditions, TI algorithms and corresponding data) required for operation and stores temporarily parameters and data generated in the course of operation. The storing unit 170 is provided in the form of one or more memory devices. The memory devices are ready-only memory (ROM), random access memory (RAM), static memory, dynamic memory, flash memory, and/or any equipment for storing digital information.

In some embodiments, another component 190 is required for assisting the electronic device 10 in performing functional operations. Take a notebook (NB) as an example, another component 190 is exemplified by a motherboard, a cooling fan, a display card, a sound card, a wireless chip, a hard disk drive, a display unit, a user interface, or any combination thereof, but the present invention is not limited thereto. In some embodiments, in addition to a notebook (NB), the electronic device 10 comes in the form of a tablet, a smartphone, a digital camera, an operating platform, a server, or a medical device.

The present invention further provides a gauging method for a battery discharge-capacity corresponding to a temperature. The gauging method for a battery discharge-capacity corresponding to a temperature comprises the steps of: detecting a temperature of a battery module of the electronic device according to a predetermined condition; detecting the internal impedance of the battery module and estimating the battery discharge-capacity of the battery module according to the internal impedance if the temperature meets the predetermined condition; and detecting a voltage and an output current of the battery module and calculating the battery discharge-capacity of the battery module according to the temperature, the voltage and the output current if the temperature does not meet the predetermined condition.

In some embodiments, according to the present invention, the gauging method for a battery discharge-capacity corresponding to a temperature is effectuated with a computer program product such that the gauging method for a battery discharge-capacity corresponding to a temperature is implemented according to any embodiment of the present invention by loading a program to an electronic device with a battery module and executing the program. In some embodiments, the computer program product is a computer-readable medium, whereas the program is stored in the computer-readable medium so as to be loaded to the electronic device. In some embodiments, the program is a computer program product and can be transmitted to the electronic device in a wired or wireless manner.

In conclusion, according to embodiments of the present invention, a gauging method for a battery discharge-capacity corresponding to a temperature and an electronic device using the same are characterized in that: the electronic device estimates a residual discharge-capacity of a battery module by a hybrid battery algorithm so that, at a low temperature, the residual discharge-capacity of the battery module is precisely estimated, so as to prevent the electronic device from malfunctioning because of erroneous battery-related information and/or prevent the electronic device from shutting down unexpectedly because of power supply interruptions.

What is claimed is:

1. A gauging method for a battery discharge-capacity corresponding to a temperature, applicable to an electronic device, the gauging method comprising the steps of:
   detecting a temperature of a battery module of the electronic device according to a predetermined condition;
   detecting the internal impedance of the battery module and estimating the battery discharge-capacity of the battery module according to the internal impedance when the temperature meets the predetermined condition; and
   detecting a voltage and an output current of the battery module and calculating the battery discharge-capacity of the battery module according to the temperature, the voltage and the output current when the temperature does not meet the predetermined condition.

2. The gauging method for a battery discharge-capacity corresponding to a temperature according to claim 1, wherein the predetermined condition is that the received temperature is higher than a temperature threshold, wherein the step of detecting a temperature of a battery module of the electronic device according to a predetermined condition comprises:
   measuring the temperature of the battery module; and
   comparing the temperature threshold with the temperature.

3. The gauging method for a battery discharge-capacity corresponding to a temperature according to claim 2, wherein the temperature meets the predetermined condition when the temperature is higher than the temperature threshold, whereas the temperature does not meet the predetermined condition when the temperature is lower than or equal to the temperature threshold.

4. The gauging method for a battery discharge-capacity corresponding to a temperature according to claim 1, wherein the step of estimating the battery discharge-capacity of the battery module according to the internal impedance comprises estimating the battery discharge-capacity of the battery module with a TI algorithm according to the internal impedance.

5. The gauging method for a battery discharge-capacity corresponding to a temperature according to claim 1, wherein the step of calculating the battery discharge-capacity of the battery module comprises calculating the battery discharge-capacity corresponding to the temperature, the voltage and the output current with a corresponding data.

6. The gauging method for a battery discharge-capacity corresponding to a temperature according to claim 5, further comprising, before the step of detecting a temperature of a battery module of the electronic device according to a predetermined condition, conducting a discharging test on a plurality of battery modules with the same delivery condition as the battery module to create the corresponding data.

7. The gauging method for a battery discharge-capacity corresponding to a temperature according to claim 5, further comprising, before the step of detecting a temperature of a battery module of the electronic device according to a predetermined condition, conducting a plurality of discharging tests on the battery module to create the corresponding data.

8. The gauging method for a battery discharge-capacity corresponding to a temperature according to claim 5, wherein the step of calculating the battery discharge-capacity of the battery module according to the temperature, the voltage and the output current comprises calculating the battery discharge-capacity with the corresponding data by interpolation.

9. The gauging method for a battery discharge-capacity corresponding to a temperature according to claim 1, further comprising displaying a power percentage on a display unit according to the battery discharge-capacity.

10. An electronic device for gauging a battery discharge-capacity corresponding to a temperature, comprising: a battery module for supplying power to the electronic device; a temperature sensing unit for measuring a temperature of the battery module; a storing unit for storing a predetermined condition; and a processing unit coupled to the battery module, the temperature sensing unit, and the storing unit to receive the temperature, wherein, when the temperature meets the predetermined condition, the processing unit will detect the internal impedance of the battery module and estimate the battery discharge-capacity of the battery module according to the internal impedance, wherein, when the temperature does not meet the predetermined condition, the processing unit will detect a voltage and an output current of the battery module and calculate the battery discharge-capacity of the battery module according to the temperature, the voltage and the output current.

11. The electronic device for gauging a battery discharge-capacity corresponding to a temperature according to claim 10, wherein the predetermined condition is a temperature threshold.

12. The electronic device for gauging a battery discharge-capacity corresponding to a temperature according to claim 11, wherein the temperature meets the predetermined condition when the temperature is higher than the temperature threshold, and the temperature does not meet the predetermined condition when the temperature is not higher than the temperature threshold.

13. The electronic device for gauging a battery discharge-capacity corresponding to a temperature according to claim 10, wherein the storing unit further stores a TI algorithm such that, when the temperature meets the predetermined condition, the processing unit estimates the battery discharge-capacity of the battery module with the TI algorithm according to the internal impedance.

14. The electronic device for gauging a battery discharge-capacity corresponding to a temperature according to claim 10, wherein the storing unit further stores a corresponding data such that, when the temperature does not meet the predetermined condition, the processing unit calculates the battery discharge-capacity corresponding to the temperature, the voltage and the output current with the corresponding data.

15. The electronic device for gauging a battery discharge-capacity corresponding to a temperature according to claim 10, further comprising a display unit coupled to the processing unit to display a power percentage indicative of the battery discharge-capacity.

* * * * *